(12) United States Patent
Gao et al.

(10) Patent No.: US 11,218,127 B2
(45) Date of Patent: Jan. 4, 2022

(54) POWER AMPLIFIER AND OVERCURRENT PROTECTION CIRCUIT

(71) Applicant: Beken Corporation, Shanghai (CN)

(72) Inventors: Donghui Gao, Shanghai (CN); Desheng Hu, Shanghai (CN); Jiazhou Liu, Shanghai (CN)

(73) Assignee: Beken Corporation, Shanghai (CN)

( * ) Notice: Subject to any disclaimer, the term of this patent is extended or adjusted under 35 U.S.C. 154(b) by 70 days.

(21) Appl. No.: 16/946,100

(22) Filed: Jun. 5, 2020

(65) Prior Publication Data
US 2021/0351756 A1 Nov. 11, 2021

(30) Foreign Application Priority Data
May 9, 2020 (CN) .......................... 202010388414.1

(51) Int. Cl.
*H03G 7/00* (2006.01)
*H03F 3/45* (2006.01)
*H03M 1/66* (2006.01)
*H04R 3/00* (2006.01)

(52) U.S. Cl.
CPC ......... *H03G 7/002* (2013.01); *H03F 3/45475* (2013.01); *H03M 1/66* (2013.01); *H04R 3/007* (2013.01); *H03F 2200/03* (2013.01); *H03F 2200/129* (2013.01); *H03F 2200/426* (2013.01); *H03F 2203/45512* (2013.01)

(58) Field of Classification Search
CPC ......... H03G 7/002; H04R 3/007; H03M 1/66; H03F 2200/03; H03F 2200/129; H03F 2200/426; H03F 2203/45512
USPC .......................................................... 381/55
See application file for complete search history.

(56) References Cited

U.S. PATENT DOCUMENTS

| 2010/0097152 A1* | 4/2010 | Wang | H03H 11/1291 331/44 |
| 2014/0133678 A1* | 5/2014 | Zhang | H03F 3/217 381/120 |
| 2015/0295584 A1* | 10/2015 | Das | H03M 1/66 341/154 |
| 2017/0294888 A1* | 10/2017 | Berkhout | H03F 3/2175 |

* cited by examiner

*Primary Examiner* — David L Ton
(74) *Attorney, Agent, or Firm* — Schwegman Lundberg & Woessner, P.A.

(57) ABSTRACT

A power amplifier includes a digital-to-analog converter, a loop filter, a driver circuit, a first adjustable reference resistor and a second adjustable reference resistor. A circuit includes an overcurrent protection circuit and a power amplifier, wherein the overcurrent protection circuit is communicatively coupled to the power amplifier. The digital-to-analog converter is configured to receive a digital signal and to output an analog signal, the driver circuit communicatively coupled to the loop filter and at least one of a first output port and a second output port of the power amplifier.

17 Claims, 7 Drawing Sheets

POWER AMPLIFIER AND OVERCURRENT PROTECTION CIRCUIT

CROSS REFERENCE TO RELATED APPLICATIONS

The application claims priority to and incorporates by reference Chinese Application No. 202010388414.1 filed May 9, 2020.

TECHNICAL FIELD

The present disclosure generally relates to circuits for a power amplifier and over current protection and methods of use thereof.

BACKGROUND

A power amplifier is an electronic amplifier that amplifies low-power electronic signals to a level that is high enough for driving electronic devices such as loudspeakers or headphones. Overcurrent is a situation where a larger than intended electric current exists through a conductor, leading to excessive generation of heat, and the risk of fire or damage to equipment.

Traditional power amplifiers are not able to adapt to the needs of generating all three types of signals, i.e., the fully differential analog signal, pseudo-differential analog signal, and single-end analog signal. Traditional overcurrent protection circuits associated with power amplifiers switch off the output when overcurrent occurs and switch it back on thereafter assuming the overcurrent has gone, as it is blind as to when the overcurrent ceases to exist. If the overcurrent situation remains persistent for a period of time, it may result in undesirable loud crackling and popping sound due to the output being switched on and off during the overcurrent situation.

SUMMARY

An embodiment provides a power amplifier comprising a digital-to-analog converter configured to receive a digital signal and to output an analog signal, a second order low pass filter communicatively coupled to the digital-to-analog converter, a driver circuit communicatively coupled to the loop filter and at least one of a first output port and a second output port of the power amplifier, a first adjustable reference resistor communicatively coupled to a negative output port of the digital-to-analog converter and the first output port of the power amplifier, and a second adjustable reference resistor communicatively coupled to a positive output port of the digital-to-analog converter and the second output port of the power amplifier.

Another embodiment provides a circuit, comprising an overcurrent protection circuit and a power amplifier, wherein the overcurrent protection circuit is communicatively coupled to the power amplifier. The power amplifier comprising a digital-to-analog converter configured to receive a digital signal and to output an analog signal, a loop filter communicatively coupled to the digital-to-analog converter, a driver circuit communicatively coupled to the loop filter and communicatively coupled to at least one of a first output port and a second output port of the power amplifier, wherein the driver circuit comprises a second operational amplifier, a seventh resistor, an eighth resistor, a third operational amplifier, a ninth resistor, and a tenth resistor, wherein the seventh resistor is communicatively coupled to a negative input port of the second operational amplifier, the eighth resistor and the voltage of common mode, wherein the eighth resistor is communicatively coupled to the first output port of the power amplifier that is communicatively coupled to an output port of the second operational amplifier, wherein the tenth resistor is communicatively coupled to the second output port of the power amplifier that is communicatively coupled to an output port of the third operational amplifier, a first adjustable reference resistor communicatively coupled to a negative output port of the digital-to-analog converter and the first output port of the power amplifier, and a second adjustable reference resistor communicatively coupled to a positive output port of the digital-to-analog converter and the second output port of the power amplifier.

In an embodiment of the circuit, the loop filter comprises an integrator, a first resistor, a second resistor, a third resistor, a fourth resistor, a fifth adjustable resistor, a sixth adjustable resistor, a third capacitor, and a fourth capacitor, wherein the integrator comprises a first operational amplifier, a first capacitor and a second capacitor, wherein the first capacitor is communicatively coupled to a negative input port and a positive output port of the first operational amplifier, wherein the second capacitor is communicatively coupled to a positive input port and a negative output port of the first operational amplifier, the first resistor is communicatively coupled to the positive output port of the first operational amplifier and is communicatively coupled to a first node that is communicatively coupled to the fifth adjustable resistor and the third resistor, the second resistor is communicatively coupled to the negative output port of the first operational amplifier and is communicatively coupled to a second node that is communicatively coupled to the sixth adjustable resistor and the fourth resistor, the fifth adjustable resistor is communicatively coupled to a third node that is communicatively coupled to the sixth adjustable resistor and a voltage of common mode, the third resistor is communicatively coupled to the first node and a fourth node that is communicatively coupled to the third capacitor, the fourth resistor is communicatively coupled to the second node and a fifth node that is communicatively coupled to the fourth capacitor, and the third capacitor is communicatively coupled to a sixth node that is communicatively coupled to fourth capacitor and the voltage of common mode.

In an embodiment of the circuit, the loop filter comprises an integrator, a first resistor, a second resistor, a third resistor, a fourth resistor, a fifth adjustable resistor, a sixth adjustable resistor, a third capacitor, and a fourth capacitor, wherein the integrator comprises a first operational amplifier, a first capacitor and a second capacitor, wherein the first capacitor is communicatively coupled to a negative input port and a positive output port of the first operational amplifier, wherein the second capacitor is communicatively coupled to a seventh node that is communicatively coupled to a voltage of common mode, and communicatively coupled to a positive input port of the first operational amplifier, the first resistor is communicatively coupled to the positive output port of the first operational amplifier and is communicatively coupled to a first node that is communicatively coupled to the fifth adjustable resistor and the third resistor, the second resistor is communicatively coupled to the seventh node and is communicatively coupled to a second node that is communicatively coupled to the sixth adjustable resistor, the fourth resistor, and the voltage of common mode, the fifth adjustable resistor is communicatively coupled to a third node that is communicatively coupled to the sixth adjustable resistor and a voltage of common mode, the third resistor is communicatively coupled to the first node and a fourth node that is communicatively coupled to the third capacitor, the fourth resistor is communicatively coupled to the second node and a fifth node that is communicatively coupled to the fourth capacitor and the voltage of common mode, and the third capacitor is communicatively coupled to a sixth node that is communicatively coupled to fourth capacitor and the voltage of common mode.

In an embodiment of the circuit, a first switch is communicatively coupled to an eight node that is communicatively coupled to the second adjustable reference resistor and an output port of the third operational amplifier.

In an embodiment of the circuit, the loop filter comprises an integrator, a first resistor, a second resistor, a third resistor, a fourth resistor, a fifth adjustable resistor, a sixth adjustable resistor, a third capacitor, and a fourth capacitor, wherein the integrator comprises a first operational amplifier, a first capacitor and a second capacitor, wherein the first capacitor is communicatively coupled to a negative input port and a positive output port of the first operational amplifier, wherein the second capacitor is communicatively coupled to a seventh node that is communicatively coupled to a voltage of common mode, and communicatively coupled to a positive input port of the first operational amplifier, the first resistor is communicatively coupled to the positive output port of the first operational amplifier and is communicatively coupled to a first node that is communicatively coupled to the fifth adjustable resistor and the third resistor, the second resistor is communicatively coupled to the seventh node and is communicatively coupled to a second node that is communicatively coupled to the sixth adjustable resistor, the fourth resistor, and the voltage of common mode, the fifth adjustable resistor is communicatively coupled to a third node that is communicatively coupled to the sixth adjustable resistor and a voltage of common mode, the third resistor is communicatively coupled to the first node and a fourth node that is communicatively coupled to the third capacitor, the fourth resistor is communicatively coupled to the second node and a fifth node that is communicatively coupled to the fourth capacitor and the voltage of common mode, and the third capacitor is communicatively coupled to a sixth node that is communicatively coupled to fourth capacitor and the voltage of common mode.

Another embodiment provides a method of generating analog output signal with a power amplifier, comprising generating a current output analog signal with a digital-to-analog converter, adjusting the current output analog signal with a feedback loop comprising loop filter and a driver circuit, adjusting a first output signal of the power amplifier with a first adjustable reference resistor and a second output signal of the power amplifier with a second adjustable reference resistor, outputting the first and second output signal of the power amplifier.

BRIEF DESCRIPTION OF THE DRAWINGS

Non-limiting and non-exhaustive embodiments are described with reference to the following figures, wherein like reference numerals refer to like parts throughout the various views unless otherwise specified.

DETAILED DESCRIPTION

Various aspects and examples will now be described. The following description provides specific details for a thorough understanding and enabling description of these examples. Those skilled in the art will understand, however, that the disclosure may be practiced without many of these details.

Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples. Certain terms may even be emphasized below, however, any terminology intended to be interpreted in any restricted manner will be overtly and specifically defined as such in this Detailed Description section.

Figure 1:
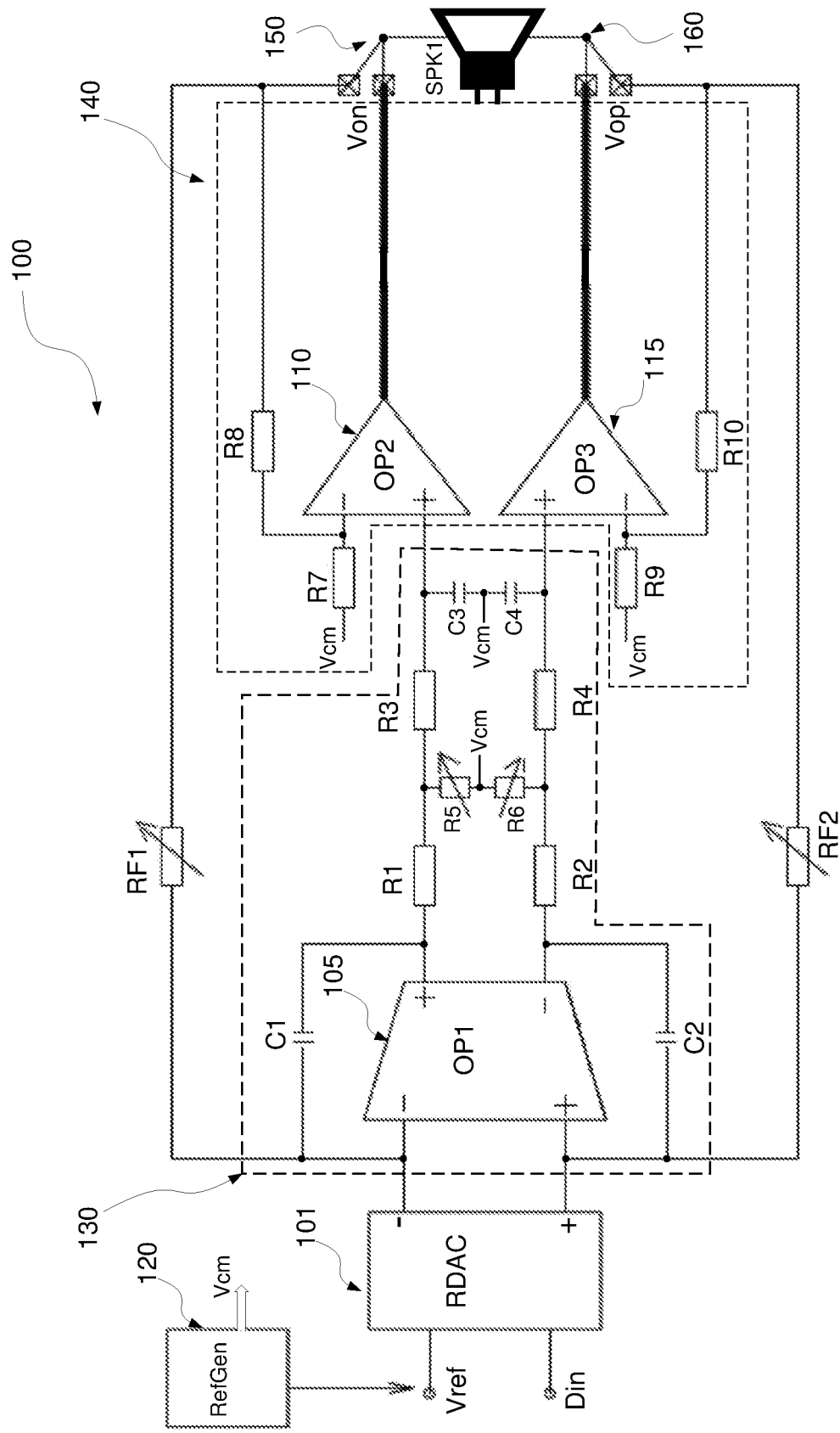
FIG. 1 is a circuit diagram of a power amplifier outputting fully differential analog signal according to an embodiment.

FIG. 1 is a circuit diagram of a power amplifier outputting fully differential analog signal according to an embodiment. In some embodiments, a power amplifier 100 comprises a digital-to-analog converter 101, a loop filter 130, a driver circuit 140, a first adjustable reference resistor RF1 and a second adjustable reference resistor RF2.

In an embodiment, the digital-to-analog converter 101 is configured to receive a digital signal input Din, a reference voltage Vref and a common mode voltage Vcm generated by a reference voltage generator 120. The digital-to-analog converter 101 is configured to output a current analog signal via a negative output port and a positive output port of the digital-to-analog converter 101. The first adjustable reference resistor RF1 is communicatively coupled to a negative output port of the digital-to-analog converter 101 and the first output port 150 of the power amplifier 100. The second adjustable reference resistor RF2 is communicatively coupled to a positive output port of the digital-to-analog converter 101 and the second output port 160 of the power amplifier 100. In some embodiments, a first speaker SPK1 is communicatively coupled in between the first output port 150 and the second output port 160 of the power amplifier 100. The first output voltage of the power amplifier 100 is Von, and the second output voltage of the power amplifier 100 is Vop. The output signal of the power amplifier 100 is a fully differential signal according to some embodiments.

According to some embodiments, the digital-to-analog converter 101 is a resistive digital-to-analog converter.

In an embodiment, the loop filter 130 is configured to attenuate an undesirable high frequency signal. In some embodiments, the loop filter removes unwanted components of the phase detection or phase comparison frequencies.

The loop filter 130 comprises an integrator, a first resistor R1, a second resistor R2, a third resistor R3, a fourth resistor R4, a fifth adjustable resistor R5, a sixth adjustable resistor R6, a third capacitor C3, and a fourth capacitor C4. The integrator comprises a first operational amplifier OP1 105, a first capacitor C1 and a second capacitor C2. The first capacitor C1 is communicatively coupled to a negative input port and a positive output port of the first operational amplifier OP1 105. The second capacitor C2 is communicatively coupled to a positive input port and a negative output port of the first operational amplifier OP1 105. According to some embodiments, the first resistor R1 is communicatively coupled to the positive output port of the first operational amplifier OP1 105 and is communicatively coupled to a first node that is communicatively coupled to the fifth adjustable resistor R5 and the third resistor R3. The second resistor R2 is communicatively coupled to the negative output port of the first operational amplifier OP1 105 and is communicatively coupled to a second node that is communicatively coupled to the sixth adjustable resistor R6 and the fourth resistor R4. The fifth adjustable resistor R5 is communicatively coupled to a third node that is communicatively coupled to the sixth adjustable resistor R6 and a voltage of common mode Vcm. The third resistor R3 is communicatively coupled to the first node and a fourth node that is communicatively coupled to the third capacitor C3. The fourth resistor R4 is communicatively coupled to the second node and a fifth node that is communicatively coupled to the fourth capacitor C4. The third capacitor C3 is communicatively coupled to a sixth node that is communicatively coupled to fourth capacitor C4 and the voltage of common mode Vcm.

In some embodiments, the driver circuit 140 is communicatively coupled to the loop filter 130 and a first output port 150 and a second output port 160 of the power amplifier 100. The driver circuit 140 comprises a second operational amplifier OP2 110, a seventh resistor R7, an eighth resistor R8, a third operational amplifier OP3 115, a ninth resistor R9, and a tenth resistor R10. The seventh resistor R7 is communicatively coupled to a negative input port of the second operational amplifier OP2 110, the eighth resistor R8 and the voltage of common mode Vcm. The eighth resistor R8 is communicatively coupled to the first output port 150 of the power amplifier 100 that is communicatively coupled to an output port of the second operational amplifier OP2 110. The tenth resistor R10 is communicatively coupled to the second output port 160 of the power amplifier 100 that is communicatively coupled to an output port of the third operational amplifier OP3 115. According to some embodiments, the value of eighth resistor R8 is 3 times of the value of the seventh resistor R7. The value of tenth resistor R10 is 3 times of the value of the ninth resistor R9.

Figure 2:
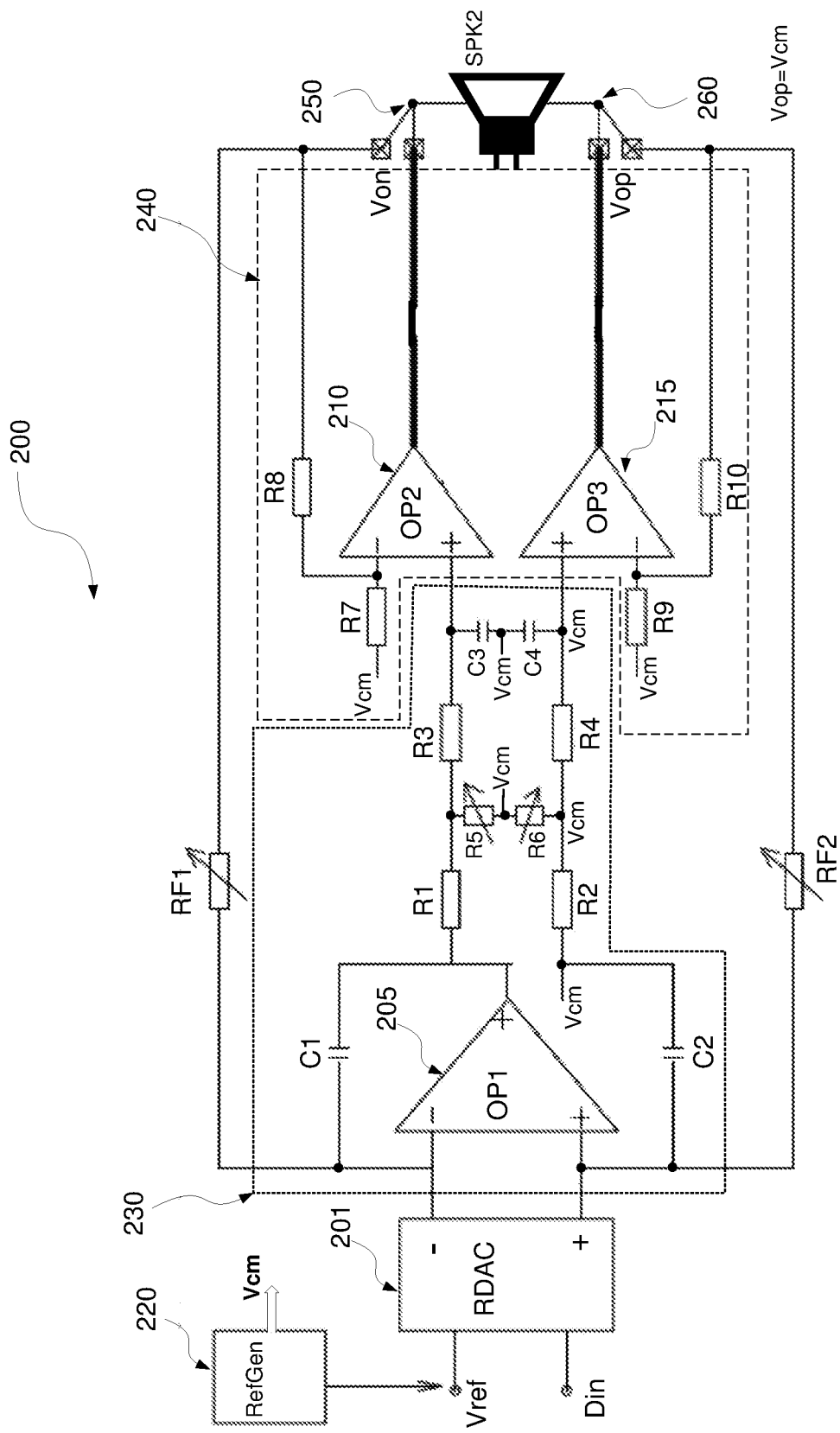
FIG. 2 is a circuit diagram of a power amplifier outputting pseudo-differential analog signal according to an embodiment.

FIG. 2 is a circuit diagram of a power amplifier outputting pseudo-differential analog signals according to an embodiment. In some embodiments, a power amplifier 200 comprises a digital-to-analog converter 201, a loop filter 230, a driver circuit 240, a first adjustable reference resistor RF1 and a second adjustable reference resistor RF2.

In an embodiment, the digital-to-analog converter 201 is configured to receive a digital signal input Din, and a reference voltage Vref and a common mode voltage Vcm, generated by a reference voltage generator 220. The digital-to-analog converter 201 is configured to output a current analog signal via a negative output port and a positive output port of the digital-to-analog converter 201. The first adjustable reference resistor RF1 is communicatively coupled to a negative output port of the digital-to-analog converter 201 and the first output port 250 of the power amplifier 200. The second adjustable reference resistor RF2 is communicatively coupled to a positive output port of the digital-to-analog converter 201 and the second output port 260 of the power amplifier 200. In some embodiments, a second speaker SPK2 is communicatively coupled in between the first output port 250 and the second output port 260 of the power amplifier 200. The first output voltage of the power amplifier 200 is Von, and the second output voltage of the power amplifier 200 is Vop. The output signal of the power amplifier 200 is a pseudo-differential signal according to some embodiments. The value of Vop equals to the value of Vcm in some embodiments.

According to some embodiments, the digital-to-analog converter 201 is a resistive digital-to-analog converter.

In an embodiment, the loop filter 230 is configured to attenuate undesirable high frequency signal. The loop filter 230 comprises an integrator, a first resistor R1, a second resistor R2, a third resistor R3, a fourth resistor R4, a fifth adjustable resistor R5, a sixth adjustable resistor R6, a third capacitor C3, and a fourth capacitor C4. The integrator comprises a first operational amplifier OP1 205, a first capacitor C1 and a second capacitor C2. The first capacitor C1 is communicatively coupled to a negative input port of and a positive output port of the first operational amplifier OP1 205. The second capacitor C2 is communicatively coupled to a seventh node that is communicatively coupled to a voltage of common mode Vcm, and communicatively coupled to a positive input port of the first operational amplifier OP1 205. The first resistor R1 is communicatively coupled to the positive output port of the first operational amplifier OP1 205 and is communicatively coupled to a first node that is communicatively coupled to the fifth adjustable resistor R5 and the third resistor R3. The second resistor R2 is communicatively coupled to the seventh node and is communicatively coupled to a second node that is communicatively coupled to the sixth adjustable resistor R6, the fourth resistor R4 and the voltage of common mode Vcm. The fifth adjustable resistor R5 is communicatively coupled to a third node that is communicatively coupled to the sixth adjustable resistor R6 and a voltage of common mode Vcm. The third resistor R3 is communicatively coupled to the first node and a fourth node that is communicatively coupled to the third capacitor C3. The fourth resistor R4 is communicatively coupled to the second node a fifth node that is communicatively coupled to the fourth capacitor C4 and the voltage of common mode Vcm. The third capacitor C3 is communicatively coupled to a sixth node that is communicatively coupled to fourth capacitor C4 and the voltage of common mode Vcm.

In some embodiments, the driver circuit 240 is communicatively coupled to the loop filter 230 and a first output port 250 and a second output port 260 of the power amplifier 200. The driver circuit 240 comprises a second operational amplifier OP2 210, a seventh resistor R7, an eighth resistor R8, a third operational amplifier OP3 215, a ninth resistor R9, and a tenth resistor R10. The seventh resistor R7 is communicatively coupled to a negative input port of the second operational amplifier OP2 210, the eighth resistor R8 and the voltage of common mode Vcm. The eighth resistor R8 is communicatively coupled to the first output port 250 of the power amplifier 200 that is communicatively coupled to an output port of the second operational amplifier OP2 210. The tenth resistor R10 is communicatively coupled to the second output port 260 of the power amplifier 200 that is communicatively coupled to an output port of the third operational amplifier OP3 215. According to some embodiments, the value of eighth resistor R8 is 3 times of the value of the seventh resistor R7. The value of tenth resistor R10 is 3 times of the value of the ninth resistor R9.

Figure 3:
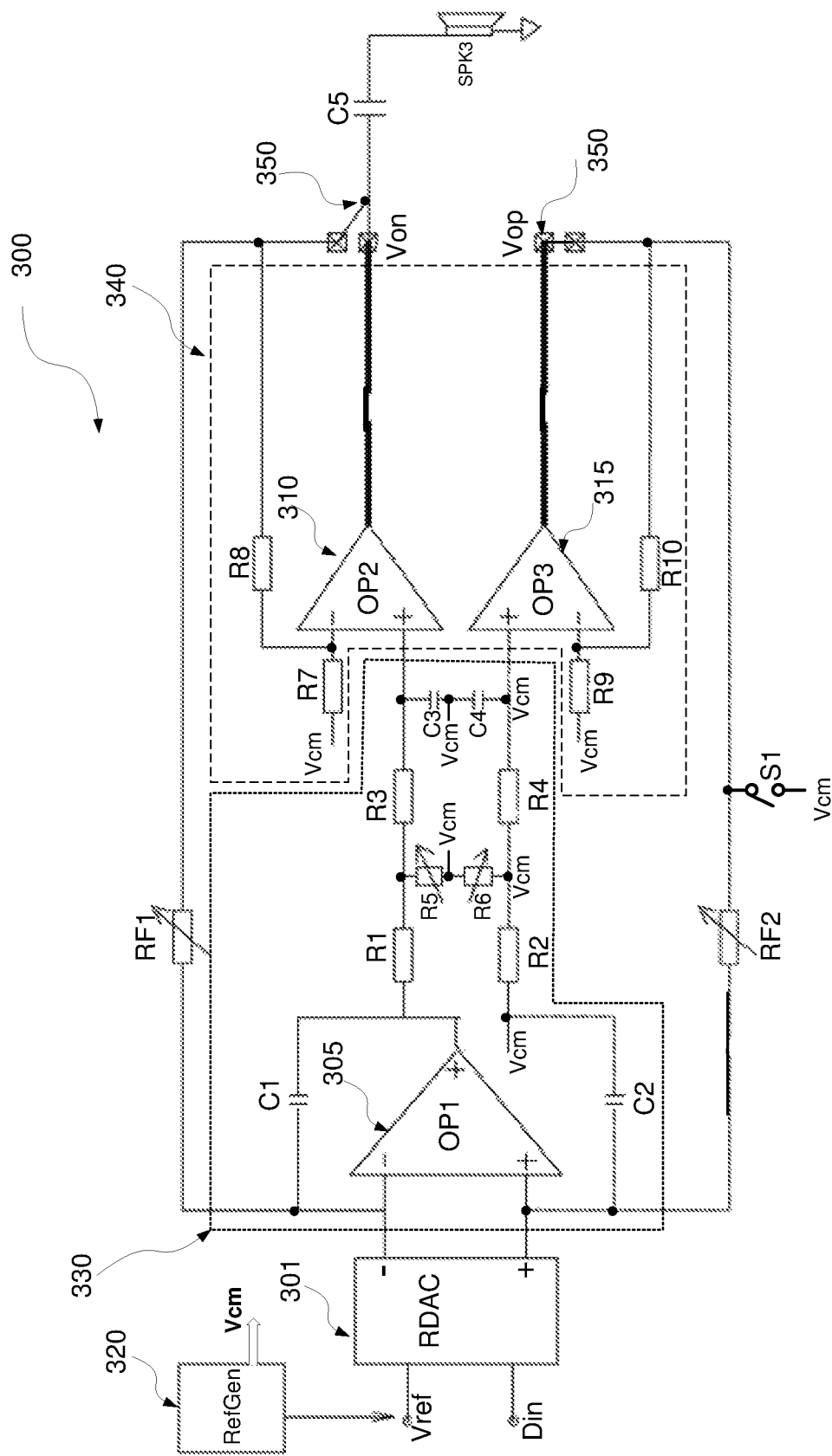
FIG. 3 is a circuit diagram of a power amplifier outputting single-ended analog signal according to an embodiment.

FIG. 3 is a circuit diagram of a power amplifier outputting single-ended analog signal according to an embodiment. In some embodiments, a power amplifier 300 comprises a digital-to-analog converter 301, a loop filter 330, a driver circuit 340, a first adjustable reference resistor RF1 and a second adjustable reference resistor RF2.

In an embodiment, the digital-to-analog converter 301 is configured to receive a digital signal input Din, a reference voltage Vref and a common mode voltage Vcm generated by a reference voltage generator 320. The digital-to-analog converter 301 is configured to output a current analog signal via a negative output port and a positive output port of the digital-to-analog converter 301. The first adjustable reference resistor RF1 is communicatively coupled to a negative output port of the digital-to-analog converter 301 and the first output port 350 of the power amplifier 300. The second adjustable reference resistor RF2 is communicatively coupled to a positive output port of the digital-to-analog converter 301 and the second output port 360 of the power amplifier 300. A first switch S1 is communicatively coupled to an eight node that is communicatively coupled to the second adjustable reference resistor RF2 and an output port of the third operational amplifier OP3. In some embodiments, the first switch S1 is coupled to the voltage of common mode Vcm and the first switch S1 remains closed.

According to some embodiments, the digital-to-analog converter 201 is a resistive digital-to-analog converter.

In some embodiments, a third speaker SPK3 is communicatively coupled to a fifth capacitor C5 that is communicatively coupled to the first output port 350 of the power amplifier 300. The first output voltage of the power amplifier 300 is Von, and the second output voltage of the power amplifier 300 is Vop. The output signal of the power amplifier 300 is a singled-ended analog signal according to some embodiments, and the value of Vop equals to zero.

In an embodiment, the loop filter 330 comprises an integrator, a first resistor R1, a second resistor R2, a third resistor R3, a fourth resistor R4, a fifth adjustable resistor R5, a sixth adjustable resistor R6, a third capacitor C3, and a fourth capacitor C4. The integrator comprises a first operational amplifier OP1 305, a first capacitor C1 and a second capacitor C2. The first capacitor C1 is communicatively coupled to a negative input port of and a positive output port of the first operational amplifier OP1 305. The second capacitor C2 is communicatively coupled to a seventh node that is communicatively coupled to a voltage of common mode Vcm, and communicatively coupled to a positive input port of the first operational amplifier OP1 305. The first resistor R1 is communicatively coupled to the positive output port of the first operational amplifier OP1 305 and is communicatively coupled to a first node that is communicatively coupled to the fifth adjustable resistor R5 and the third resistor R3. The second resistor R2 is communicatively coupled to the seventh node and is communicatively coupled to a second node that is communicatively coupled to the sixth adjustable resistor R6, the fourth resistor R4 and the voltage of common mode Vcm. The fifth adjustable resistor R5 is communicatively coupled to a third node that is communicatively coupled to the sixth adjustable resistor R6 and a voltage of common mode Vcm. The third resistor R3 is communicatively coupled to the first node and a fourth node that is communicatively coupled to the third capacitor C3. The fourth resistor R4 is communicatively coupled to the second node a fifth node that is communicatively coupled to the fourth capacitor C4 and the voltage of common mode Vcm. The third capacitor C3 is communicatively coupled to a sixth node that is communicatively coupled to fourth capacitor C4 and the voltage of common mode Vcm.

In some embodiments, the driver circuit 340 comprises a second operational amplifier OP2 310, a seventh resistor R7, an eighth resistor R8, a third operational amplifier OP3 315, a ninth resistor R9, and a tenth resistor R10. The seventh resistor R7 is communicatively coupled to a negative input port of the second operational amplifier OP2 310, the eighth resistor R8 and the voltage of common mode. The eighth resistor R8 is communicatively coupled to the first output port 350 of the power amplifier 300 that is communicatively coupled to an output port of the second operational amplifier OP2 310 and a fifth capacitor C5. The tenth resistor R10 is communicatively coupled to the second output port 350 of the power amplifier 300 that is communicatively coupled to an output port of the third operational amplifier. According to some embodiments, the value of eighth resistor R8 is 3 times of the value of the seventh resistor R7. The value of tenth resistor R10 is 3 times of the value of the ninth resistor R9.

Figure 4:
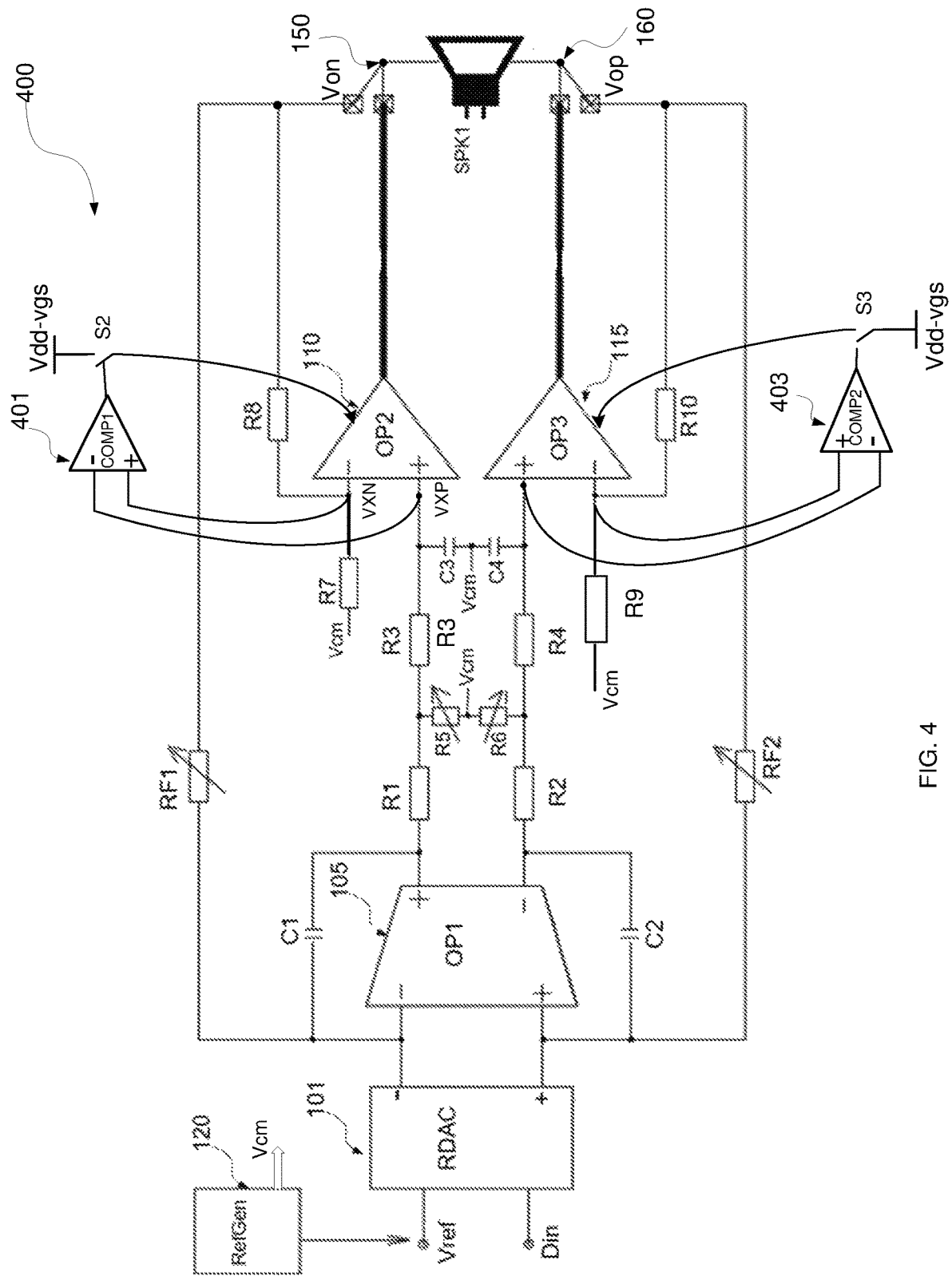
FIG. 4 is a circuit diagram of an overcurrent protection circuit communicatively coupled with the power amplifier described in FIG. 1 according to an embodiment.

FIG. 4 is a circuit diagram of an overcurrent protection circuit communicatively coupled with the power amplifier described in FIG. 1 according to an embodiment. In some embodiments, a circuit 400 comprises an overcurrent protection circuit and a power amplifier, that the overcurrent protection circuit is communicatively coupled to the power amplifier. The overcurrent protection circuit comprises a first comparator 401, a second switch S2, a second comparator 403 and a third switch S3. In some embodiments, the overcurrent protection circuit resides in both of the second operational amplifier OP2 and the third operational amplifier OP3.

According to an embodiment, the negative input port of the first comparator 401 is communicatively coupled to the positive input port of the second operational amplifier OP2 110. The positive input port of the first comparator 401 is communicatively coupled to the negative input port of the second operational amplifier OP2 110. The second switch S2 is communicatively coupled to the output port of the first comparator 401 and an adjustable voltage Vdd-vgs. The second switch is communicatively coupled to the second operational amplifier OP110. In some embodiments, S2 is controlled by COMP1.

According to some embodiments, the negative input port of the second comparator 403 is communicatively coupled to the positive input port of the third operational amplifier OP3 115. The positive input port of the second comparator 403 is communicatively coupled to the negative input port of the third operational amplifier OP3 115. The third switch is communicatively coupled to the output port of the second comparator 403 and the adjustable voltage Vdd-vgs. The third switch S3 is communicatively coupled to the third operational amplifier OP3 115. In some embodiments, S3 is controlled by COMP2.

In some embodiments, a person of ordinary skill of art shall appreciate that the overcurrent circuit may be similarly coupled to power amplifier in FIG. 2, and FIG. 3 to achieve overcurrent protection functions.

In some embodiments, during normal operation of the power amplifier, the negative input voltage VXN and the positive input voltage VXP of the second operational amplifier OP2 110 shall remain the same or similar within few millivolt differences, which is referred to as the offset voltage of OP2. According to some embodiments, the trigger voltage of the first comparator COMP1 is 110 mV, so that the output of COMP1 is HIGH, that the second switch S2 is open. However, for example, when the first output port 150 of the power amplifier is accidentally communicatively coupled to the ground GND resulting in overcurrent situation, in response to the overcurrent and by operation of the circuit 400, the voltage VXN deviates significantly from voltage VXP when the value of VXN decreases from the value of VXP for more than 110 mV, activating the first comparator 401 causing which to output LOW, resulting in the closure of the second switch S2. Voltage Vdd-vgs subsequently passes to a gate of a PMOS transistor residing inside of the second operational amplifier to protect the circuit 400 from damages caused by an overcurrent situation. Any person skilled in the art shall appreciate that, similarly, if the second output port 160 of the power amplifier is accidentally communicatively coupled to the ground GND resulting in overcurrent situation, deviation in voltages between the positive and negative input ports of the third operational amplifier OP3 115 triggers the second comparator 403 and causes the third switch S3 to close, in order to achieve overcurrent protection functions.

Figure 5:
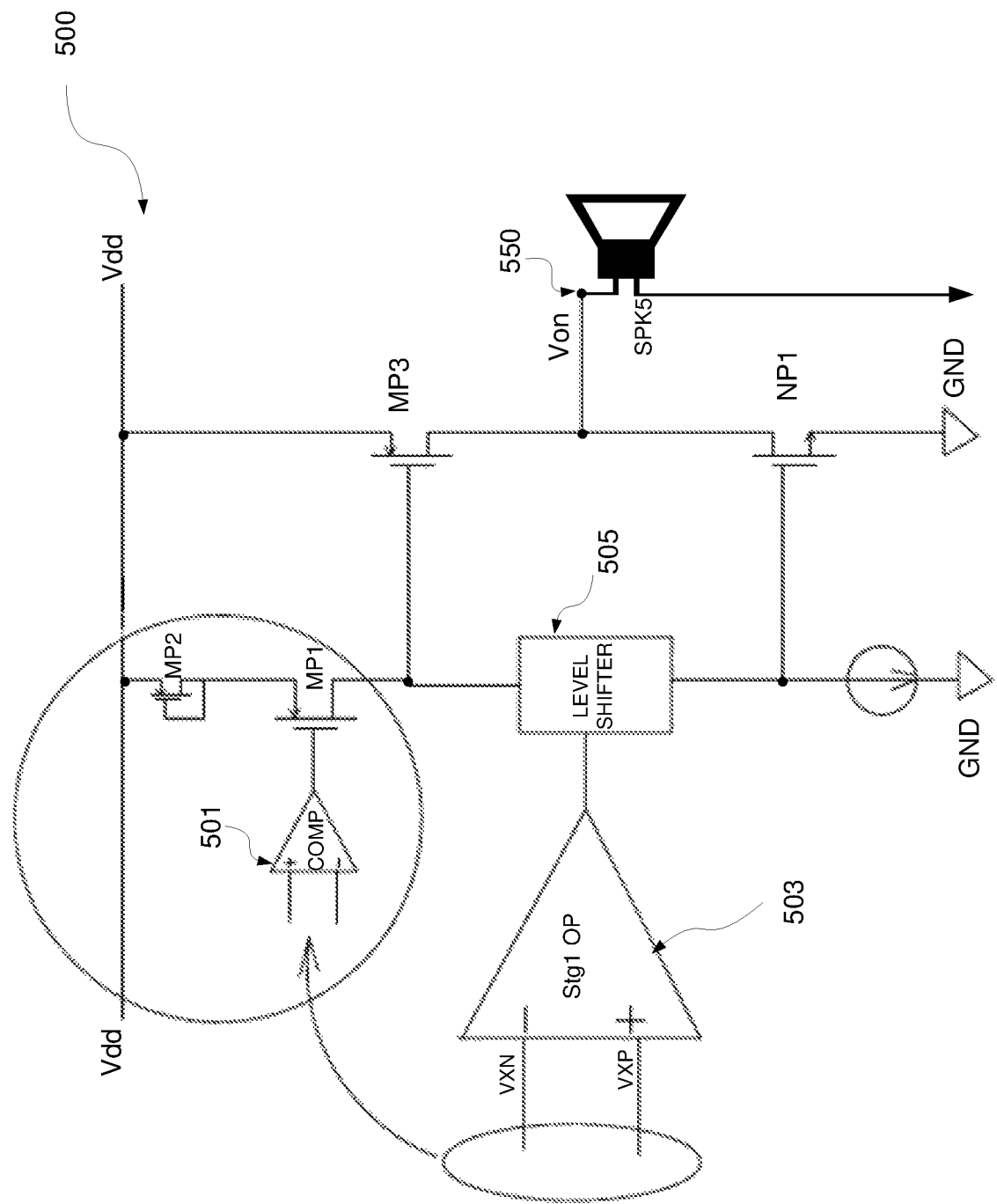
FIG. 5 is a circuit diagram of a specific example of an overcurrent protection circuit according to an embodiment.

FIG. 5 is a circuit diagram of a specific example of an overcurrent protection circuit according to an embodiment. In some embodiments, the circuit 500 resides in the second operational amplifier OP2 and the third operational amplifier OP3. The second operational amplifier 110, 210, 310 comprises a stage 1 operational amplifier 503, a level shifter 505, a third PMOS transistor MP3, a first NMOS transistor NP1. In some embodiments, the comparator 501 is the first comparator 401 and the first PMOS transistor MP1 operates as the second switch S2 in FIG. 4. A fixed voltage Vdd passes through the second PMOS transistor MP2 and generates a fixed voltage Vgg-vgs. When overcurrent situation occurs as the output port 550 of the power amplifier 110, 210, 310 is accidentally coupled to ground GND, a large current flows through the drain of the third PMOS transistor MP3, causing the voltage of the gate of the MP3 to drop significantly, such as dropping from 6 mA working current to −500 mA. Any person skilled in the art should appreciate that, in response to the overcurrent situation and by operation of the circuit 400, the negative input voltage VXN deviates significantly from the positive input voltage VXP, causing the comparator 501 to operate and output LOW. It results in the fixed voltage Vdd passing through MP2 as Vdd-vgs, which in turn passes to the gate of MP3 via MP1 operating as a closed switch, forcing the voltage of the gate of MP3 to be stabilized as a fixed voltage Vdd-vgs, in order to maintain a workable operation of the circuit 400 during an overcurrent situation. Any person skilled in the art should appreciate that, as soon as the overcurrent situation ceases to exist, the MP1 switches back to an open state that the circuit returns to the normal operation.

Figure 6:
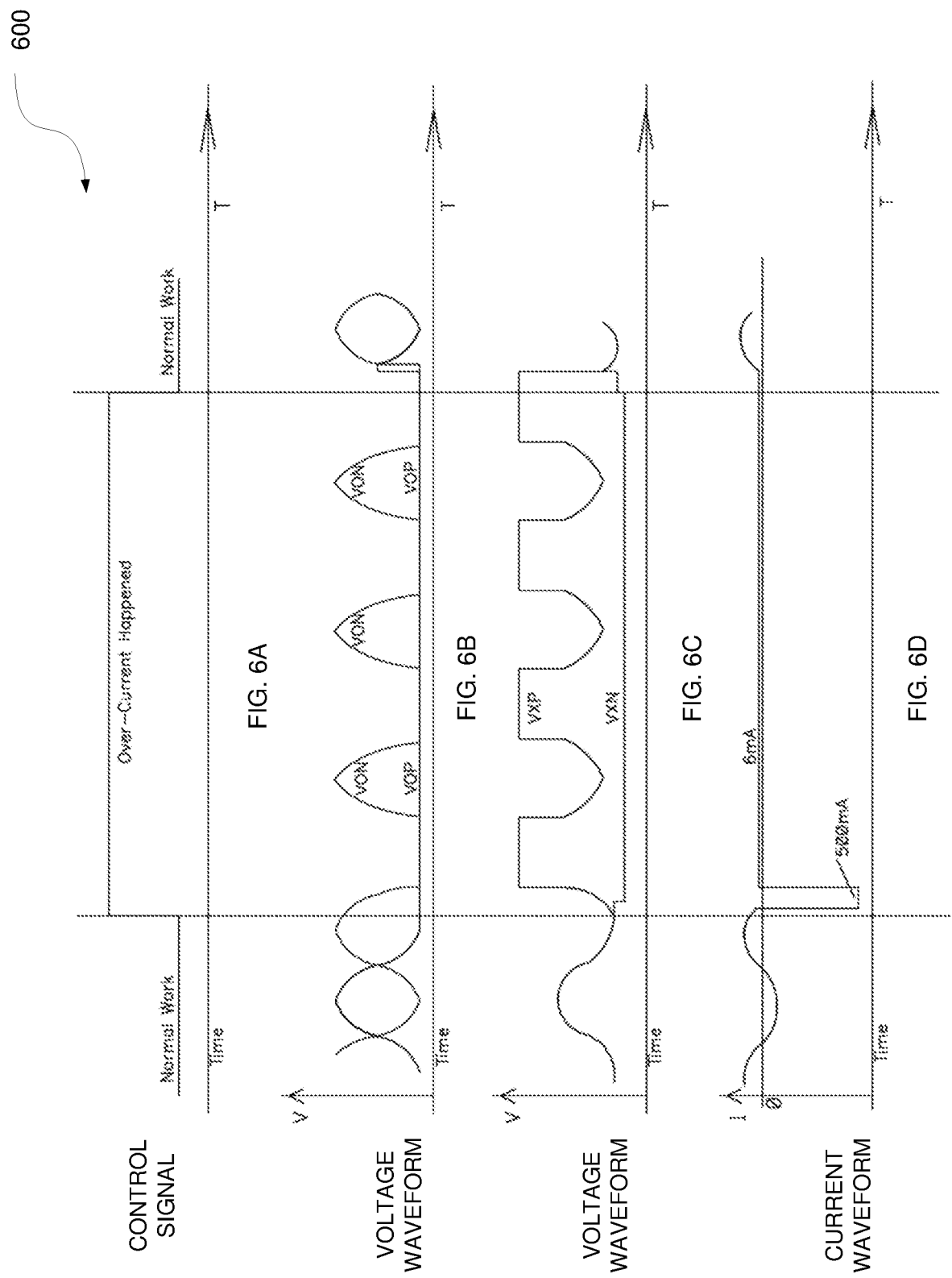
FIG. 6A-FIG. 6D respectively illustrate different waveform diagrams when an overcurrent situation occurs according to an embodiment.

FIG. 6A-FIG. 6D respectively illustrate different waveform diagrams when an overcurrent situation occurs according to an embodiment. FIG. 6A shows the changes of a control signal of the power amplifier 100, 200, and 300 before, during and after overcurrent situation. FIG. 6B shows the changes of waveforms of output voltage Von and Vop of the power amplifier 100, 200, and 300 before, during and after overcurrent situation. FIG. 6C shows the changes of waveforms of input voltages of second operational amplifier 110, 210, 310 VXN and VXP before, during and after overcurrent situation. FIG. 6D shows the changes of current waveforms of the power amplifier 100, 200, and 300 before, during and after overcurrent situation.

Figure 7:
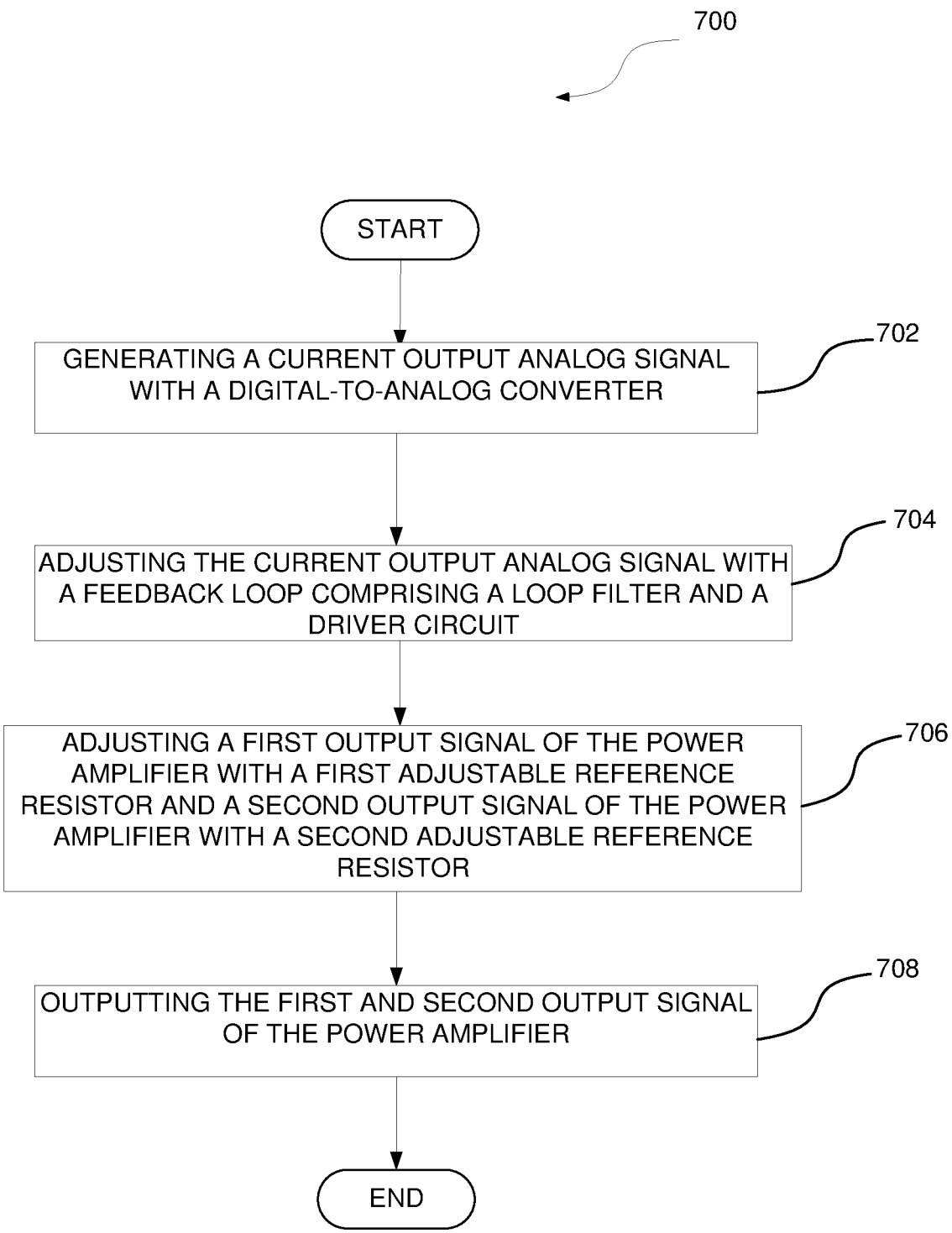
FIG. 7 is a flow chart of a method of generating an analog signal with a power amplifier according to an embodiment.

FIG. 7 is a flow chart of a method generating analog signal with a power amplifier according to an embodiment. In some embodiments, the exemplary method illustrated may be operable by the power amplifier 100 in FIG. 1, the power amplifier 200 in FIG. 2, and/or the power amplifier 300 in FIG. 3. According to some embodiments, the method 700 may begin at operation 702 with the digital-to-analog converter generating a current output analog signal. The digital-to-analog converter may be a resistive digital-to-analog converter. At operation 704, a feedback look comprising a loop filter and a driver circuit adjusts the current output analog signal. At operation 706, a first adjustable reference resistor adjusts a first output signal of the power amplifier, and a second adjustable reference resistor adjusts a second output signal of the power amplifier. At operation 708, the power amplifier outputs the first and second output signal.

According to some embodiments, the loop filter 130, 230, 330 is communicatively coupled to the digital-to-analog converter 101, 201, 301. The driver circuit 140, 240, 340 is communicatively coupled to the loop filter 130, 230, 330 and communicatively coupled to at least one of a first output port 150, 250, 350 and a second output port 160, 260, 360 of the power amplifier 100, 200, 300. The first adjustable reference resistor RF1 is communicatively coupled to a negative output port of the digital-to-analog converter 101, 201, 301 and the first output port 150, 250, 350 of the power amplifier 100, 200, 300. The second adjustable reference resistor RF1 communicatively coupled to a positive output port of the digital-to-analog converter 101, 201, 301 and the second output port 160, 260, 360 of the power amplifier 100, 200, 300.

According to some embodiments, a speaker SPK1, SPK2, is communicatively coupled between the first output port 150, 250 and the second output port 160, 260 of the power amplifier 100, 200.

In an embodiment, a fifth capacitor C5 is communicatively coupled between a speaker SPK3 and the first output port 350 of the power amplifier 300.

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present disclosure. Moreover, features of one embodiment may be incorporated into other embodiments, even where those features are not described together in a single embodiment within the present document. Accordingly, the disclosure is described by the appended claims.

What is claimed is:
1. A power amplifier, comprising:
  a digital-to-analog converter configured to receive a digital signal and to output an analog signal;
  a loop filter communicatively coupled to the digital-to-analog converter, wherein the loop filter comprises an integrator, a first resistor, a second resistor, a third resistor, a fourth resistor, a fifth adjustable resistor, a sixth adjustable resistor, a third capacitor, and a fourth capacitor, and wherein:
    the integrator comprises a first operational amplifier, a first capacitor and a second capacitor, wherein the first capacitor is communicatively coupled to a negative input port and a positive output port of the first operational amplifier, wherein the second capacitor is communicatively coupled to a positive input port and a negative output port of the first operational amplifier, the first resistor is communicatively coupled to the positive output port of the first operational amplifier and is communicatively coupled to a first node that is communicatively coupled to the fifth adjustable resistor and the third resistor, the second resistor is communicatively coupled to the negative output port of the first operational amplifier and is communicatively coupled to a second node that is communicatively coupled to the sixth adjustable resistor and the fourth resistor, the fifth adjustable resistor is communicatively coupled to a third node that is communicatively coupled to the sixth adjustable resistor and a voltage of common mode, the third resistor is communicatively coupled to the first node and a fourth node that is communicatively coupled to the third capacitor, the fourth resistor is communicatively coupled to the second node and a fifth node that is communicatively coupled to the fourth capacitor, and the third capacitor is communicatively coupled to a sixth node that is communicatively coupled to fourth capacitor and the voltage of common mode;

a driver circuit communicatively coupled to the loop filter and at least one of a first output port and a second output port of the power amplifier;

a first adjustable reference resistor communicatively coupled to a negative output port of the digital-to-analog converter and the first output port of the power amplifier; and a second adjustable reference resistor communicatively coupled to a positive output port of the digital-to-analog converter and the second output port of the power amplifier.

2. The power amplifier of claim 1, wherein the driver circuit comprises a second operational amplifier, a seventh resistor, an eighth resistor, a third operational amplifier, a ninth resistor, and a tenth resistor, wherein the seventh resistor is communicatively coupled to a negative input port of the second operational amplifier, the eighth resistor and the voltage of common mode;

the eighth resistor is communicatively coupled to the first output port of the power amplifier that is communicatively coupled to an output port of the second operational amplifier; and the tenth resistor is communicatively coupled to the second output port of the power amplifier that is communicatively coupled to an output port of the third operational amplifier.

3. The power amplifier of claim 1, wherein the digital-to-analog converter is a current output digital-to-analog converter.

4. A power amplifier, comprising:

a digital-to-analog converter configured to receive a digital signal and to output an analog signal;

a loop filter communicatively coupled to the digital-to-analog converter, wherein the loop filter comprises an integrator, a first resistor, a second resistor, a third resistor, a fourth resistor, a fifth adjustable resistor, a sixth adjustable resistor, a third capacitor, and a fourth capacitor, and wherein:

the integrator comprises a first operational amplifier, a first capacitor and a second capacitor, wherein the first capacitor is communicatively coupled to a negative input port and a positive output port of the first operational amplifier, wherein the second capacitor is communicatively coupled to a seventh node that is communicatively coupled to a voltage of common mode, and communicatively coupled to a positive input port of the first operational amplifier, the first resistor is communicatively coupled to the positive output port of the first operational amplifier and is communicatively coupled to a first node that is communicatively coupled to the fifth adjustable resistor and the third resistor, the second resistor is communicatively coupled to the seventh node and is communicatively coupled to a second node that is communicatively coupled to the sixth adjustable resistor, the fourth resistor and the voltage of common mode, the fifth adjustable resistor is communicatively coupled to a third node that is communicatively coupled to the sixth adjustable resistor and a voltage of common mode;

the third resistor is communicatively coupled to the first node and a fourth node that is communicatively coupled to the third capacitor, the fourth resistor is communicatively coupled to the second node a fifth node that is communicatively coupled to the fourth capacitor and the voltage of common mode, and the third capacitor is communicatively coupled to a sixth node that is communicatively coupled to fourth capacitor and the voltage of common mode;

a driver circuit communicatively coupled to the loop filter and at least one of a first output port and a second output port of the power amplifier;

a first adjustable reference resistor communicatively coupled to a negative output port of the digital-to-analog converter and the first output port of the power amplifier; and a second adjustable reference resistor communicatively coupled to a positive output port of the digital-to-analog converter and the second output port of the power amplifier.

5. The power amplifier of claim 4, wherein the driver circuit comprises a second operational amplifier, a seventh resistor, an eighth resistor, a third operational amplifier, a ninth resistor, and a tenth resistor, wherein the seventh resistor is communicatively coupled to a negative input port of the second operational amplifier, the eighth resistor and the voltage of common mode;

the eighth resistor is communicatively coupled to the first output port of the power amplifier that is communicatively coupled to an output port of the second operational amplifier; and the tenth resistor is communicatively coupled to the second output port of the power amplifier that is communicatively coupled to an output port of the third operational amplifier.

6. A power amplifier, comprising:

a digital-to-analog converter configured to receive a digital signal and to output an analog signal;

a loop filter communicatively coupled to the digital-to-analog converter;

a driver circuit communicatively coupled to the loop filter and at least one of a first output port and a second output port of the power amplifier;

a first adjustable reference resistor communicatively coupled to a negative output port of the digital-to-analog converter and the first output port of the power amplifier; and a second adjustable reference resistor communicatively coupled to a positive output port of the digital-to-analog converter and the second output port of the power amplifier, wherein a first switch is communicatively coupled to an eight node that is communicatively coupled to the second adjustable reference resistor and an output port of a third operational amplifier.

7. The power amplifier of claim 6, wherein the loop filter comprises an integrator, a first resistor, a second resistor, a third resistor, a fourth resistor, a fifth adjustable resistor, a sixth adjustable resistor, a third capacitor, and a fourth capacitor, wherein the integrator comprises a first operational amplifier, a first capacitor and a second capacitor, wherein the first capacitor is communicatively coupled to a negative input port and a positive output port of the first operational amplifier, wherein the second capacitor is communicatively coupled to a seventh node that is communicatively coupled to a voltage of common mode, and communicatively coupled to a positive input port of the first operational amplifier;

the first resistor is communicatively coupled to the positive output port of the first operational amplifier and is communicatively coupled to a first node that is communicatively coupled to the fifth adjustable resistor and the third resistor;

the second resistor is communicatively coupled to the seventh node and a second node that is communicatively coupled to the sixth adjustable resistor, the fourth resistor and the voltage of common mode;

the fifth adjustable resistor is communicatively coupled to a third node that is communicatively coupled to the sixth adjustable resistor and a voltage of common mode;

the third resistor is communicatively coupled to the first node and a fourth node that is communicatively coupled to the third capacitor;

the fourth resistor is communicatively coupled to the second node a fifth node that is communicatively coupled to the fourth capacitor and the voltage of common mode; and the third capacitor is communicatively coupled to a sixth node that is communicatively coupled to fourth capacitor and the voltage of common mode.

8. The power amplifier of claim 6, wherein the driver circuit comprises a second operational amplifier, a seventh resistor, an eighth resistor, a third operational amplifier, a ninth resistor, and a tenth resistor, wherein the seventh resistor is communicatively coupled to a negative input port of the second operational amplifier, the eighth resistor and a voltage of common mode;

the eighth resistor is communicatively coupled to the first output port of the power amplifier that is communicatively coupled to an output port of the second operational amplifier and a fifth capacitor; and the tenth resistor is communicatively coupled to the second output port of the power amplifier that is communicatively coupled to an output port of the third operational amplifier.

9. A circuit, comprising an overcurrent protection circuit and a power amplifier, wherein the overcurrent protection circuit is communicatively coupled to the power amplifier; the power amplifier comprising:

a digital-to-analog converter configured to receive a digital signal and to output an analog signal;

a loop filter communicatively coupled to the digital-to-analog converter;

a driver circuit communicatively coupled to the loop filter and communicatively coupled to at least one of a first output port and a second output port of the power amplifier, wherein the driver circuit comprises a second operational amplifier, a seventh resistor, an eighth resistor, a third operational amplifier, a ninth resistor, and a tenth resistor, wherein the seventh resistor is communicatively coupled to a negative input port of the second operational amplifier, the eighth resistor and a voltage of common mode, wherein the eighth resistor is communicatively coupled to the first output port of the power amplifier that is communicatively coupled to an output port of the second operational amplifier, wherein the tenth resistor is communicatively coupled to the second output port of the power amplifier that is communicatively coupled to an output port of the third operational amplifier;

a first adjustable reference resistor communicatively coupled to a negative output port of the digital-to-analog converter and the first Output port of the power amplifier; and a second adjustable reference resistor communicatively coupled to a positive output port of the digital-to-analog converter and the second output port of the power amplifier; and the overcurrent protection circuit comprising:

a first comparator, wherein a negative input port of the first comparator is communicatively coupled to the positive input port of the second operational amplifier, wherein a positive input port of the first comparator is communicatively coupled to the negative input port of the second operational amplifier;

a second switch connected to the output port of the first comparator and an adjustable voltage, wherein the second switch is communicatively coupled to the second operational amplifier;

a second comparator, wherein a negative input port of the second comparator is communicatively coupled to the positive input port of the third operational amplifier, wherein a positive input port of the second comparator is communicatively coupled to the negative input port of the third operational amplifier; and a third switch connected to the output port of the second comparator and the adjustable voltage, wherein the third switch is communicatively coupled to the third operational amplifier.

10. The circuit of claim 9, wherein the loop filter comprises an integrator, a first resistor, a second resistor, a third resistor, a fourth resistor, a fifth adjustable resistor, a sixth adjustable resistor, a third capacitor, and a fourth capacitor, wherein the integrator comprises a first operational amplifier, a first capacitor and a second capacitor, wherein the first capacitor is communicatively coupled to a negative input port and a positive output port of the first operational amplifier, wherein the second capacitor is communicatively coupled to a positive input port and a negative output port of the first operational amplifier;

the first resistor is communicatively coupled to the positive Output port of the first operational amplifier and is communicatively coupled to a first node that is communicatively coupled to the fifth adjustable resistor and the third resistor;

the second resistor is communicatively coupled to the negative output port of the first operational amplifier and is communicatively coupled to a second node that is communicatively coupled to the sixth adjustable resistor and the fourth resistor;

the fifth adjustable resistor is communicatively coupled to a third node that is communicatively coupled to the sixth adjustable resistor and a voltage of common mode;

the third resistor is communicatively coupled to the first node and a fourth node that is communicatively coupled to the third capacitor;

the fourth resistor is communicatively coupled to the second node and a fifth node that is communicatively coupled to the fourth capacitor; and the third capacitor is communicatively coupled to a sixth node that is communicatively coupled to fourth capacitor and the voltage of common mode.

11. The circuit of claim 9, wherein the loop filter comprises an integrator, a first resistor, a second resistor, a third resistor, a fourth resistor, a fifth adjustable resistor, a sixth adjustable resistor, a third capacitor, and a fourth capacitor, wherein the integrator comprises a first operational amplifier, a first capacitor and a second capacitor, wherein the first capacitor is communicatively coupled to a negative input port and a positive output port of the first operational amplifier, wherein the second capacitor is communicatively coupled to a seventh node that is communicatively coupled to a voltage of common mode, and communicatively coupled to a positive input port of the first operational amplifier;

the first resistor is communicatively coupled to the positive output port of the first operational amplifier and is communicatively coupled to a first node that is communicatively coupled to the fifth adjustable resistor and the third resistor;

the second resistor is communicatively coupled to the seventh node and is communicatively coupled to a second node that is communicatively coupled to the sixth adjustable resistor, the fourth resistor, and the voltage of common mode;

the fifth adjustable resistor is communicatively coupled to a third node that is communicatively coupled to the sixth adjustable resistor and a voltage of common mode;

the third resistor is communicatively coupled to the first node and a fourth node that is communicatively coupled to the third capacitor;

the fourth resistor is communicatively coupled to the second node a fifth node that is communicatively coupled to the fourth capacitor and the voltage of common mode; and the third capacitor is communicatively coupled to a sixth node that is communicatively coupled to fourth capacitor and the voltage of common mode.

12. The circuit of claim 9, wherein a first switch is communicatively coupled to an eight node that is communicatively coupled to the second adjustable reference resistor and an output port of the third operational amplifier.

13. The circuit of claim 12 wherein the loop filter comprises an integrator, a first resistor, a second resistor, a third resistor, a fourth resistor, a fifth adjustable resistor, a sixth adjustable resistor, a third capacitor, and a fourth capacitor, wherein the integrator comprises a first operational amplifier, a first capacitor and a second capacitor, wherein the first capacitor is communicatively coupled to a negative input port and a positive output port of the first operational amplifier, wherein the second capacitor is communicatively coupled to a seventh node that is communicatively coupled to a voltage of common mode, and communicatively coupled to a positive input port of the first operational amplifier;

the first resistor is communicatively coupled to the positive output port of the first operational amplifier and is communicatively coupled to a first node that is communicatively coupled to the fifth adjustable resistor and the third resistor;

the second resistor is communicatively coupled to the seventh node and is communicatively coupled to a second node that is communicatively coupled to the sixth adjustable resistor, the fourth resistor, and the voltage of common mode;

the fifth adjustable resistor is communicatively coupled to a third node that is communicatively coupled to the sixth adjustable resistor and a voltage of common mode;

the third resistor is communicatively coupled to the first node and a fourth node that is communicatively coupled to the third capacitor;

the fourth resistor is communicatively coupled to the second node a fifth node that is communicatively coupled to the fourth capacitor and the voltage of common mode; and the third capacitor is communicatively coupled to a sixth node that is communicatively coupled to fourth capacitor and the voltage of common mode.

14. The circuit of claim 9, wherein the digital-to-analog converter is a current output digital-to-analog converter.

15. A method of generating analog output signal with a power amplifier, comprising:

generating a current output analog signal with a digital-to-analog converter;

adjusting the current output analog signal with a feedback loop comprising a loop filter and a driver circuit wherein the loop filter is communicatively coupled to the digital-to-analog converter, and wherein the driver circuit is communicatively coupled to the loop filter and communicatively coupled to at least one of a first output port and a second output port of the power amplifier;

adjusting a first output signal of the power amplifier with a first adjustable reference resistor and a second output signal of the power amplifier with a second adjustable reference resistor, wherein the first adjustable reference resistor is communicatively coupled to a negative output port of the digital-to-analog converter and the first output port of the power amplifier, and wherein the second adjustable reference resistor is communicatively coupled to a positive output port of the digital-to-analog converter and the second output port of the power amplifier; and outputting the first and second output signal of the power amplifier.

16. The method of generating analog output signal with the power amplifier in claim 15, wherein a speaker is communicatively coupled between the first output port and the second Output port of the power amplifier.

17. The method of generating analog output signal with the power amplifier in claim 15, wherein a fifth capacitor is communicatively coupled between a speaker and the first output port of the power amplifier.

\* \* \* \* \*